(12) United States Patent
Ricci et al.

(10) Patent No.: US 8,342,494 B2
(45) Date of Patent: Jan. 1, 2013

(54) ALIGNING STRUCTURE FOR A POWER LINE AND SENSOR

(75) Inventors: Marc A. Ricci, Victoria (CA); Colin Gunn, Victoria (CA); Sam Gaib, Victoria (CA); Stewart Harding, Victoria (CA)

(73) Assignee: Schneider Electric USA, Inc., Palatine, IL (US)

( * ) Notice: Subject to any disclaimer, the term of this patent is extended or adjusted under 35 U.S.C. 154(b) by 264 days.

(21) Appl. No.: 11/938,613

(22) Filed: Nov. 12, 2007

(65) Prior Publication Data

US 2008/0129314 A1 Jun. 5, 2008

Related U.S. Application Data

(60) Provisional application No. 60/858,618, filed on Nov. 13, 2006.

(51) Int. Cl.
*B25B 5/00* (2006.01)
*G01R 1/04* (2006.01)

(52) U.S. Cl. .......................................... 269/86; 269/903

(58) Field of Classification Search ................ 269/217, 269/103, 249; 174/140 CR, 140 R, 144, 174/127
See application file for complete search history.

(56) References Cited

U.S. PATENT DOCUMENTS

| | | | |
|---|---|---|---|
| 3,599,910 A | 8/1971 | Wipff et al. | |
| 3,828,291 A | 8/1974 | Urani | |
| 4,087,889 A | 5/1978 | Ohba et al. | |
| 4,148,542 A | 4/1979 | Wood | |
| 4,440,368 A | 4/1984 | Kitchen | |
| 4,532,486 A | 7/1985 | Terrier | |
| 4,672,508 A | 6/1987 | Bridges | |
| 4,695,913 A | 9/1987 | Terracol et al. | |
| 4,714,893 A | 12/1987 | Smith-Vaniz et al. | |
| 4,716,496 A | 12/1987 | Fritsch | |
| 4,734,639 A | 3/1988 | Saletta et al. | |
| 4,746,241 A | 5/1988 | Burbank, III | |
| 4,962,443 A | 10/1990 | Cole | |
| 5,426,360 A * | 6/1995 | Maraio et al. | 324/126 |
| 5,586,909 A | 12/1996 | Saba | |
| 6,109,575 A | 8/2000 | Munson | |
| 6,181,548 B1 | 1/2001 | Wheeler | |
| 6,329,810 B1 | 12/2001 | Reid | |
| 6,445,782 B1 * | 9/2002 | Elfe et al. | 379/201.01 |
| 6,455,782 B1 * | 9/2002 | Lin et al. | 174/140 CR |
| 6,483,289 B2 | 11/2002 | Reid | |
| 6,713,997 B2 | 3/2004 | Carlson et al. | |
| 7,090,454 B2 | 8/2006 | Shain | |

(Continued)

OTHER PUBLICATIONS

Socomec Group, "Operating Instructions for DIRIS Model A40/A41," Installation instructions, p. 10, date unknown (71 pages).

(Continued)

*Primary Examiner* — Lee D Wilson
*Assistant Examiner* — Jamal Daniel
(74) *Attorney, Agent, or Firm* — Nixon Peabody LLP

(57) ABSTRACT

An apparatus includes a first jaw (108) coupled to a second jaw (110) to form an opening (114) when the first jaw (108) and the second jaw (110) are closed. An aligning structure couples to at least one of the first jaw (108) and the second jaw (110). A portion of the aligning structure may be disposed within the opening (114) and aligns a power line (128) to a sensor (418) disposed within the first jaw (108) and the second jaw (110).

9 Claims, 5 Drawing Sheets

U.S. PATENT DOCUMENTS

| | | |
|---|---|---|
| 7,180,717 B2 | 2/2007 | Kojovic et al. |
| 7,282,944 B2 | 10/2007 | Gun et al. |
| 7,336,063 B1 | 2/2008 | Bierer |
| 2006/0279910 A1* | 12/2006 | Gunn et al. .................... 361/600 |
| 2008/0129314 A1* | 6/2008 | Ricci et al. .................... 324/555 |
| 2008/0284410 A1 | 11/2008 | Perez |

OTHER PUBLICATIONS

Merlin Gerin, "Technical Data Sheet 2003 Power-monitoring Unit PowerLogic System for Power Meter PM500," Installation and Connection, p. 7, 2003 (8 pages).

* cited by examiner

ALIGNING STRUCTURE FOR A POWER LINE AND SENSOR

CROSS-REFERENCE TO RELATED APPLICATIONS

The present application claims the benefit of U.S. Provisional Application Ser. No. 60/858,618, filed Nov. 13, 2006 and hereby incorporates that application by reference in its entirety.

FIELD OF THE INVENTION

This invention relates to power measurement devices, including but not limited to power measurement devices that align to a power line.

BACKGROUND OF THE INVENTION

Line devices exist that attach to power lines in order to measure various electrical parameters of the power line. Known devices, such as the power donuts described in U.S. Pat. No. 4,746,241 issued to Burbank, include a donut-shaped outer housing with an inner hub of a fixed size that connects to a single size or diameter of power line. In order for the power donut to operate in conjunction with a different size power line, one must change out the inner hub, which may be a time-consuming process when many power donuts need to be changed. Further, the installer must bear the full weight of the power-donut during installation and removal, which takes place at the end of a long rod known as a "hot stick" in the industry. Accordingly, there is a need for a line device that does not suffer from these problems.

SUMMARY

An apparatus includes a first jaw coupled to a second jaw to form an opening when the first jaw and the second jaw are closed. An aligning structure couples to at least one of the first jaw and the second jaw. A portion of the aligning structure is disposed within the opening and aligns a power line to a sensor disposed within the first jaw and the second jaw.

DESCRIPTION OF EMBODIMENTS

The following describes an apparatus for aligning a sensor to a power line. An aligning structure consistently positions an outer perimeter or diameter of a power line inside the opening of a line device, thereby consistently aligning the power line to a sensor that measures an electrical parameter of the power line. The aligning structure may fix to a single diameter of power line or may manually or automatically adjust to various diameters of power lines.

Figure 1:
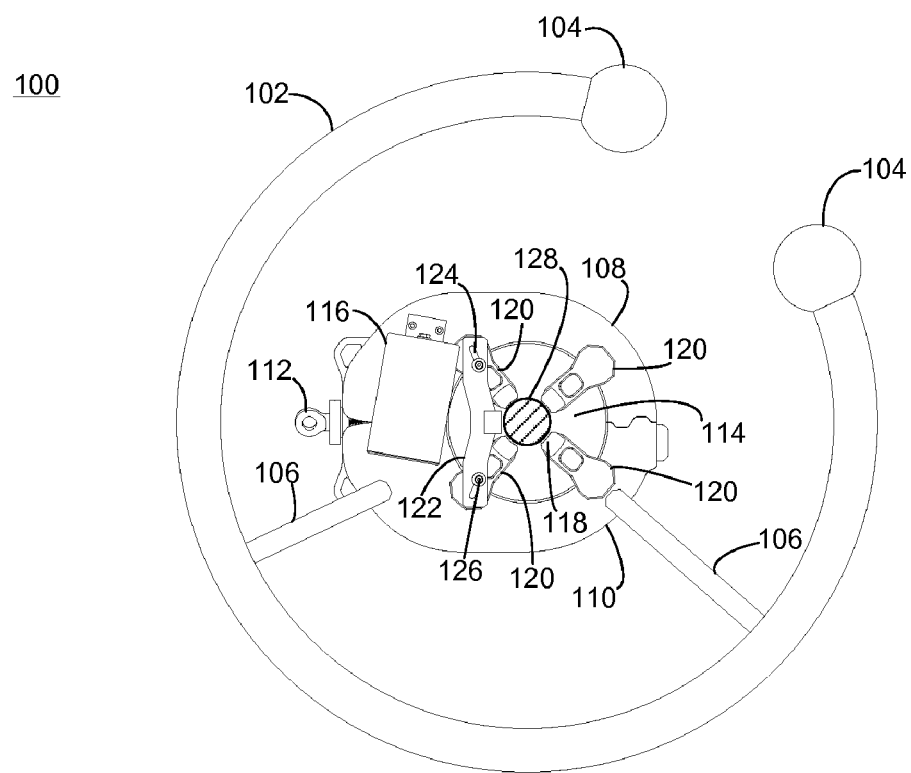
FIG. 1 is a front view of a first embodiment of a line device with a first aligning structure for a power line in accordance with the invention.

A front view of a line device 100 is shown in FIG. 1 that is utilized to measure and store at least one power parameter, such as voltage, current, phase angle, power, or power factor, for a power line 128, such as a conductor, cable, bus conduit, and so forth, and may be applied to a power line 128 having a voltage of 1 kV to 765 kV. The line device 100 has a corona ring 102 that is comprised of a partial ring of conductive material that has a circular cross-section of a first diameter. A spherical end 104, comprised of conductive material, is disposed on each end of the partial ring, wherein each of the spherical end 104 has a second diameter that is substantially larger than the first diameter. The diameter of the spherical ends 104 and the cross-section of the corona ring 102 are selected to be sufficient to distribute the electric field that results in a minimized corona effect on the power line 128. The diameter of the spherical ends 104 increases as the voltage of the power line 128 increases. The diameter of the spherical ends 104 also increases as the distance between the spherical ends 104 increases. The second diameter may be 10 to 25 cm, depending on the voltage of the power line 128 and the distance between the spherical ends 104. The larger diameter of the spherical ends 104 provides the advantage of minimizing corona effect. The diameter of the cross-section of the corona ring 102 need not be as large as the diameter of the spherical ends 104. The corona ring 102 is connected by one or more supports 106 to one of two jaws 108 and 110 of the line device 100.

Figure 2:
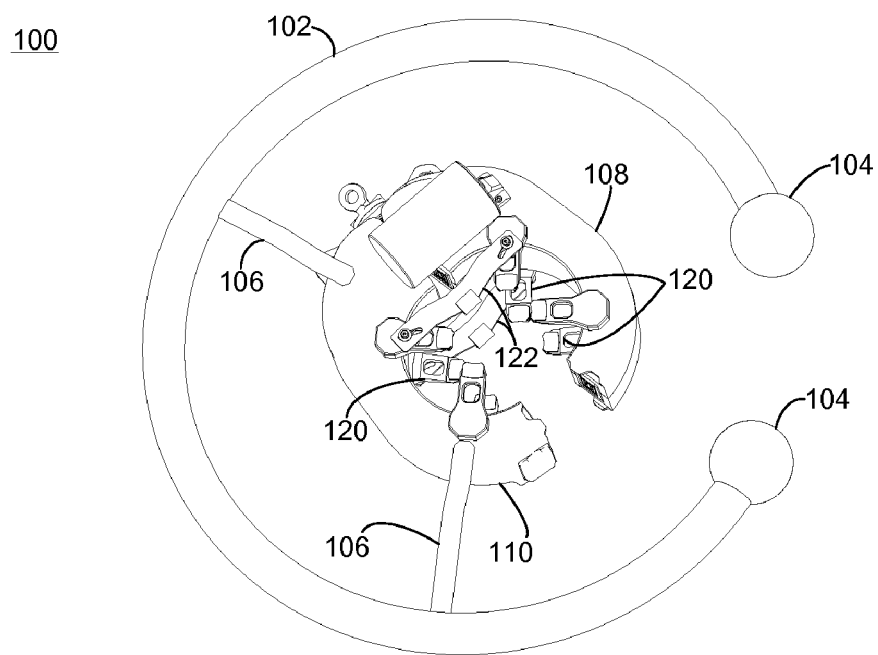
FIG. 2 is a perspective view of the first embodiment of a line device with the first aligning structure for the power line in accordance with the invention.

Although the corona ring 102 is only shown in FIG. 1 and FIG. 2, a corona ring 102 may be utilized in conjunction with any of the embodiments in FIG. 3 through 8. The corona ring 102 is not shown in these figures for the sake of simplicity. A corona ring 102 is generally utilized when the voltage of the power line 128 is greater than approximately 120 kV, and may optionally be utilized at lower voltages. The corona ring 102 is smaller and easier to manufacture and install than prior corona rings. The corona ring 102 assists with installation and removal of the line device 100, 300, 400, or 700 because its partial ring configuration facilitates temporarily hanging the line device 100, 300, 400, or 700 from the power line 128.

A hinge-like connection is formed at one end of each of the jaws 108 and 110, which are generally comprised of a lightweight metallic material, such as aluminum. Alternatively, a synthetic or semi-synthetic polymer may be utilized to reduce weight and increase manufacturability. When the jaws are closed, such as shown in FIG. 1, an opening 114 is formed by the two jaws 108 and 110. A hot stick connection 112 is utilized to open and close the jaws 108 and 110, wherein the ends of the jaws 108 and 110 opposite the hinge-like connection separate. A hot stick connects to the hot stick connection 112. A hot stick is a long stick that a person can utilize to install a line device 100, 300, 400, or 700 while maintaining electrical isolation from the power line 128 that may be energized during the placement of the line device 100. The corona ring 102 is generally not co-planar with the jaws 108 and 110 to provide access to the hot stick connection 112.

An aligning structure is utilized to align the power line 128 to a sensor (not shown; see FIG. 4) disposed in the jaws 108 and 110. The aligning structure in FIG. 1 comprises a plurality of alignment members 120 and an opposing member 122. In this embodiment, the alignment members 120 are each approximately the same fixed size and are coupled to the first jaw and the second jaw 108 and 110. The end 118 of each of the alignment members 120 in this embodiment advantageously has a curved surface that mates to the curvature of the power line 128 so that a more secure alignment is provided. The first jaw 108, the second jaw 110, and the aligning structure grip the power line in a secure manner so that the power line 128 is consistently positioned inside the opening 114.

When installing the line device 100, 300, 400, or 700, the power line 128 may rest against an optional opposing member 122 while the jaws 108 and 110 are closed, to help provide a more stable placement of the power line 128 and to insure that the power line 128 is not pinched by the jaws 108 and 110. The opposing member 122 has slots 124 through which pins 126 attach the opposing member 122 to two of the alignment members 120. As shown in FIG. 2, a perspective view of the line device 100, the alignment members 120 are disposed on a front face of the jaws 108 and 110 as well as on a back face of the jaws 108 and 110, such that the alignment members are axially spaced with respect to a longitudinal axis of the power line 128. This axial spacing provides more stability in maintaining a consistent position of the power line with respect to the opening 114 and hence the sensor 418.

The line device 100, 300, 400, or 700 may be powered through an onboard power source such as one or more batteries 116 (not shown in FIG. 3 through FIG. 8). Alternatively, the line device 100, 300, 400, or 700 may be powered indirectly from the power line's 128 electric field by utilizing free body capacitance of the corona ring 102 as known in the art.

Figure 3:
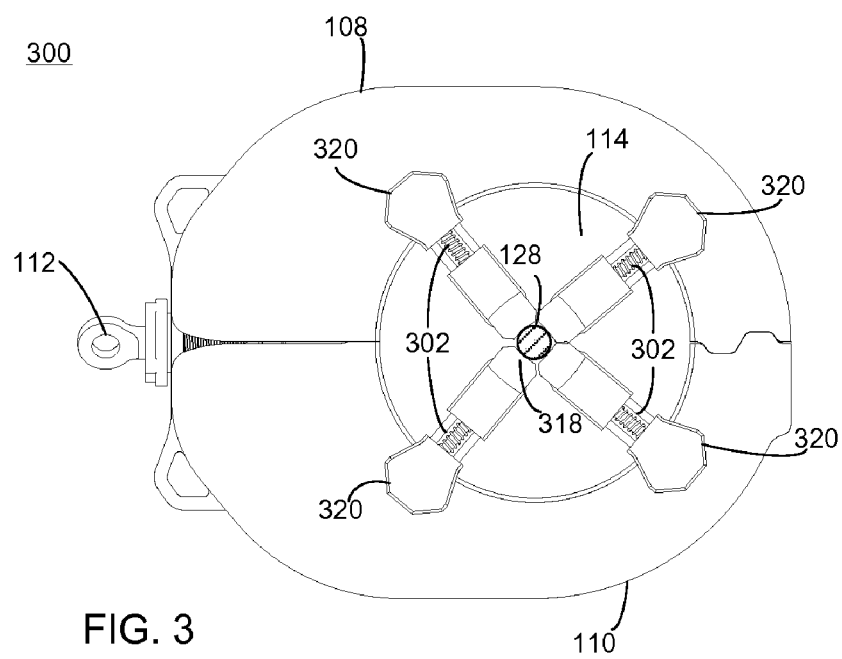
FIG. 3 is a front view of a second embodiment of a line device with a second aligning structure for a power line in accordance with the invention.

An alternative embodiment of an aligning structure is shown with respect to the line device 300 in FIG. 3. This embodiment of the aligning structure comprises alignment members 320 that are adjustable so that the aligning structure automatically adapts to various diameters of power lines 128. In this embodiment, the alignment members 320 contain an internal spring 302 that facilitates radial expanding and contracting of the ends 318 of the alignment members to meet with the outer perimeter of the power line 128. The ends 318 of the alignment members 320 have a curved surface that mates with the curved outer diameter of the power line 128.

Figure 4:
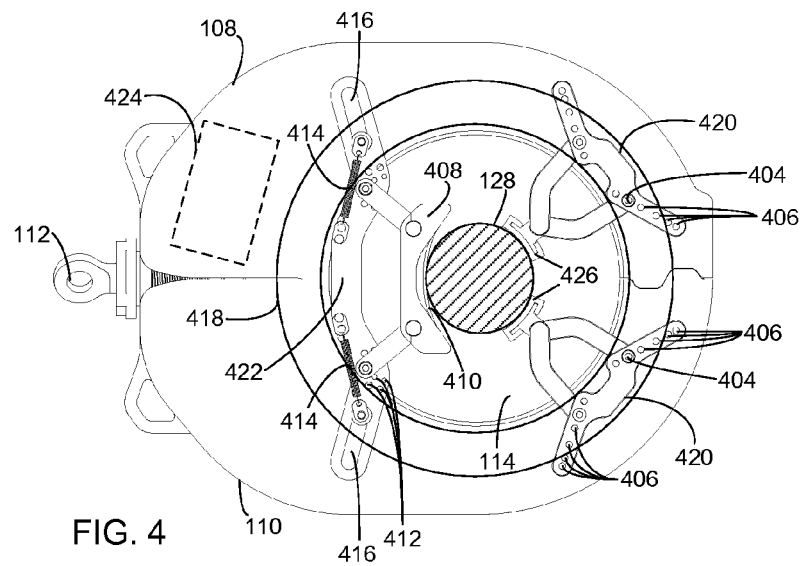
FIG. 4 is a front view of a third embodiment of a line device with a third aligning structure for a power line in accordance with the invention.

Another alternative embodiment of the aligning structure is shown in FIG. 4. In this embodiment of a line device 400, a first member 420 is fixed to the first jaw 108 and a second member 420 is fixed to the second jaw 110. The first member and the second member 420 are manually adjustable via a plurality of holes 406 through which pins 404 connect the member 420 to the jaw 108 or 110 in order to adjust the aligning structure to the diameter of the power line 128. A radially inward end 426 of the first and second member 420 has a curved surface that has a large curved surface that mates with a curved outer surface of the power line 128.

Across from the first member 420 and the second member 420 is a floating member 422. The floating member 422 slidably couples to the jaws 108 and 110 while retaining one spatial relationship with a center of the opening 114. The floating member 422 is coupled to the first jaw 108 and the second jaw 110 via a pair of springs 414. One end of each spring 414 is fixed to the floating member 422 and the other end of each spring 414 is fixed to each of the jaws 108 and 110 through-slots 416 that permit the jaws 108 and 110 to open and close while the floating member substantially retains one spatial relationship with the center of the opening 114. An opposing member 408 is operably coupled to the floating member 422 and a deformable member 410. A deformable member 410 receives the power line 128 during installation of the line device 400. When the jaws 108 and 110 are closed, the deformable member 110, the first member 420, and the second member 420 secure the power line 128 in a consistent position inside the opening 114.

Also shown in FIG. 4 is a sensor 418, as known in the art, shown in the form of a current transformer with a split core, one part of the split core disposed in the first jaw 108 and a second part of the split core disposed in the second jaw 110. When the jaws 108 and 110 are closed, the two parts of the sensor 418 are in contact with each other such that the sensor 418 forms a single core when the jaws 108 and 110 are closed. The sensor 418 may alternatively comprise multiple cores, which cores may provide various functions, including compensation. The sensor 418 is electronically coupled to an electronic assembly 424 that receives data from the sensor 418 related to the power line 128, and processes, stores, and communicates the data as needed. The electronic assembly 424 may include a processor, memory, a power supply, and a communication circuit. The processor processes the data from the sensor 418 and may perform calculations or other analysis on the data. The memory may store the data and/or a program for operating the processor. The communication circuit may download the data from memory or contemporaneously communicate the data to an external device that receives the data.

Figure 5:
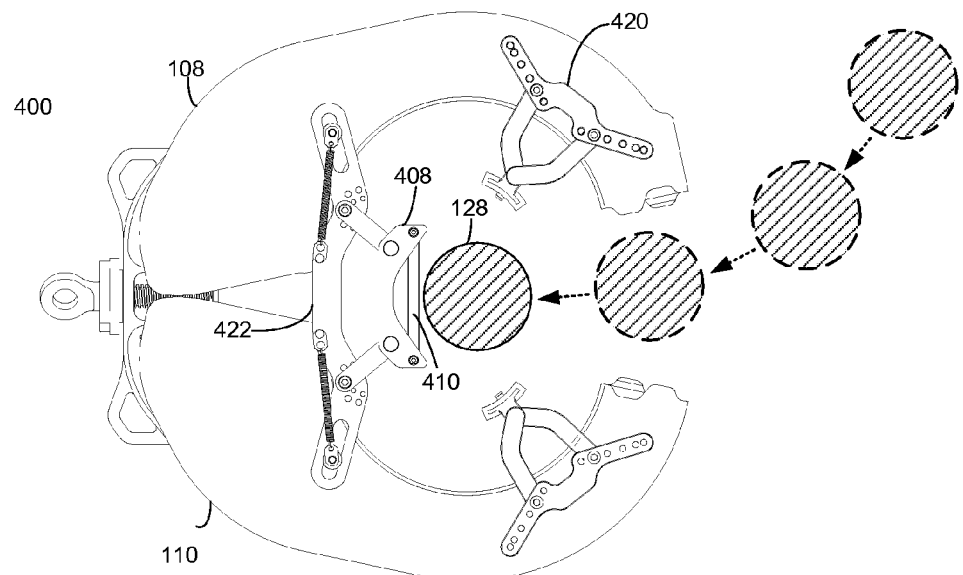
FIG. 5 is a front view of the third embodiment of a line device with the third aligning structure shown as the power line enters the third line device in accordance with the invention.

FIG. 5 illustrates various positions of the power line 128 with respect to the line device 400 as the power line 128 enters the space between the opened jaws 108 and 110, enters the opening 114, and approaches the deformable member 410. The jaws 108 and 110 may then close, as the aligning members 420 and 408 converge on the power line 128 to align the power line 128 to the sensor 418.

Figure 6:
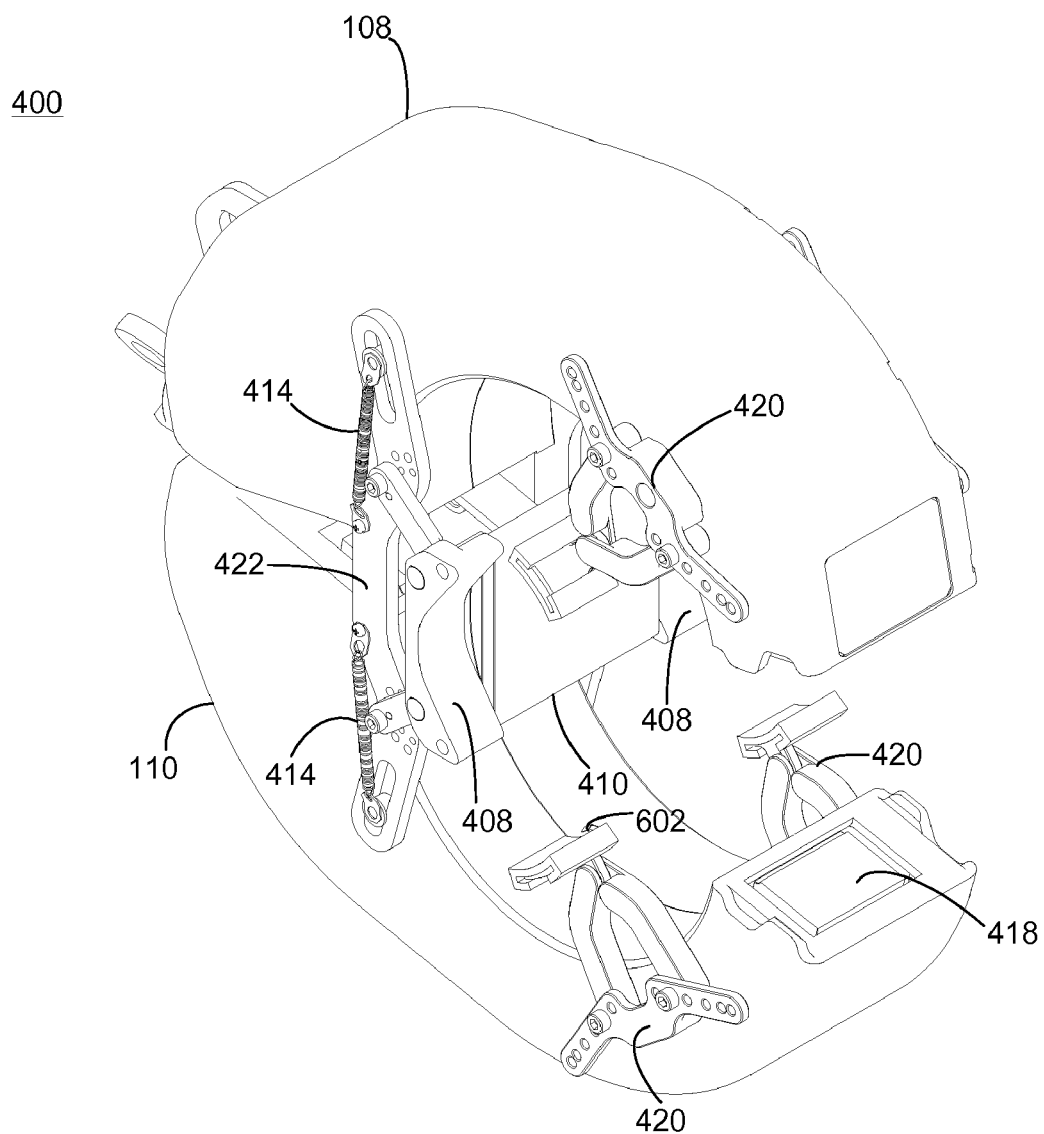
FIG. 6 is a perspective view of the third embodiment of a line device with the third aligning structure for the power line in accordance with the invention.

A perspective view of this embodiment of the line device 400 is shown in FIG. 6. The deformable member 410, which is comprised of a deformable yet strong material, is mounted between axially spaced alignment members 408. One end of one of the split cores of the sensor 418 is shown in this perspective view disposed in the jaw 110.

Figure 7:
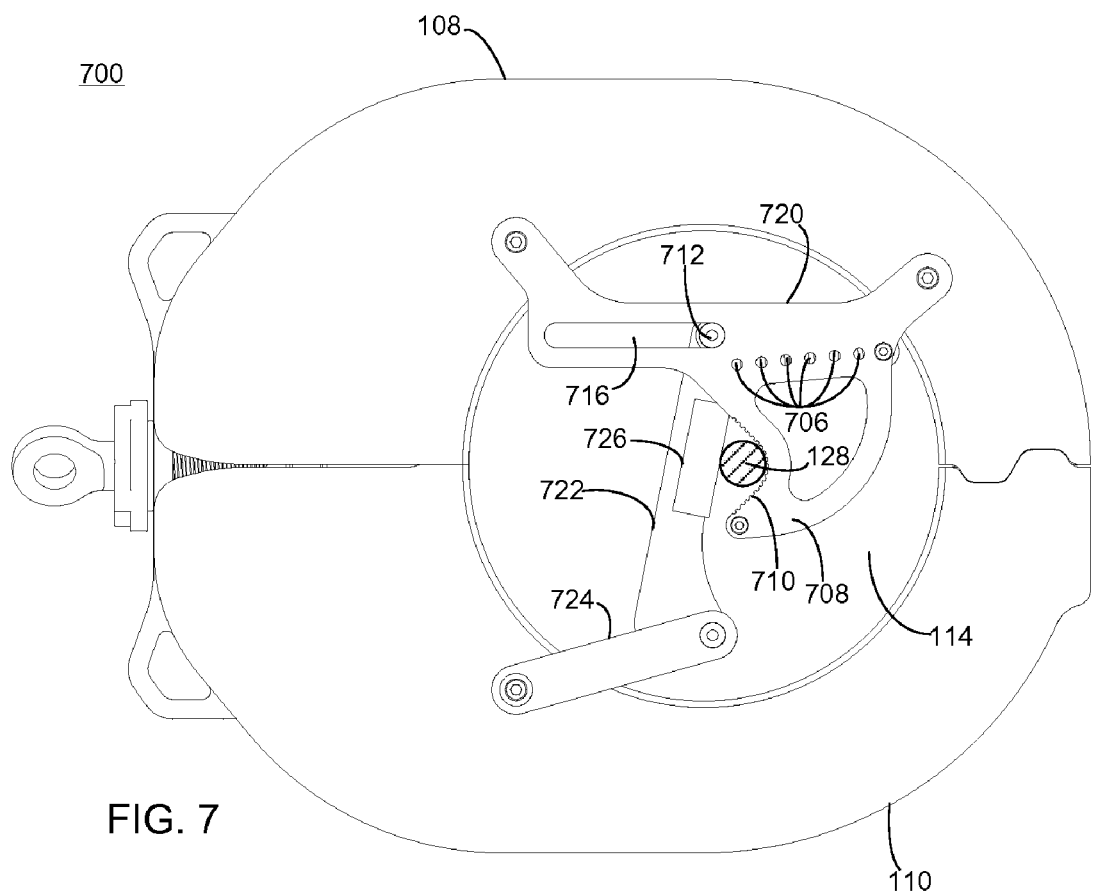
FIG. 7 is a front view of a fourth embodiment of a line device with a fourth aligning structure for a power line in accordance with the invention.
Figure 8:
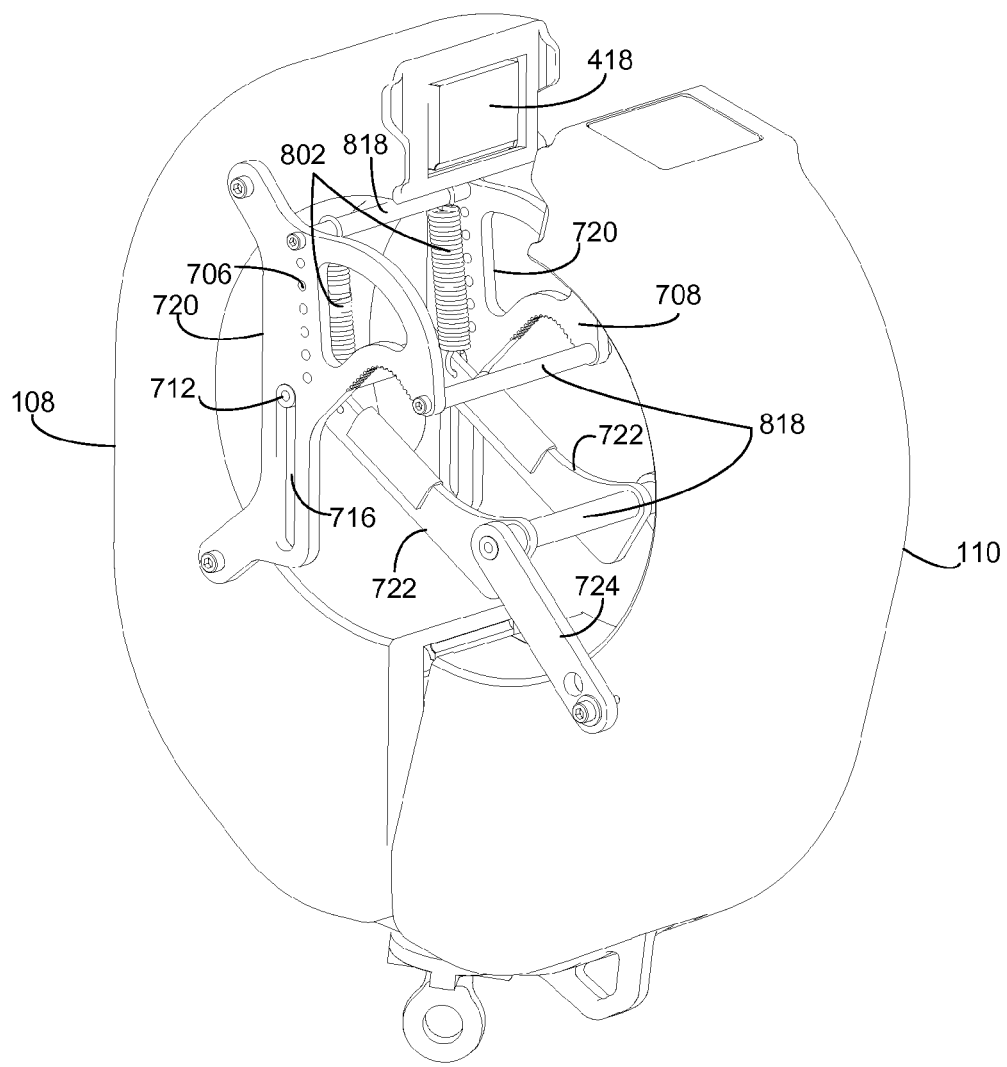
FIG. 8 is a perspective view of the fourth line device with the fourth aligning structure for the power line in accordance with the invention.

Another embodiment of an aligning structure is shown for a line device 700 in FIG. 7. A fixed member 720 is coupled to one of the jaws 108, advantageously at two connection points. The fixed member 720 has a hook 708 that advantageously has a serrated edge or teeth 710 that provide more grip to the power line 128. This fixed member 720 has a plurality of adjustment holes 706 that may be utilized to adjust the aligning structure to various sizes of power line 128. An axial stabilizer 818 as shown in FIG. 8 disposed in a selected adjustment hole 706. The axial stabilizer 818 is disposed between two axially spaced fixed members 720 and attaches to a pair of springs 802.

An opposing member 722 is slidably coupled to the fixed member 720. The opposing member 722 advantageously includes an optional non-conductive material 726, such as rubber or plastic that improves the grip or security of the power line 128 between the hook 708 and the opposing member 722, and/or provides electrical insulation. A pin 712 at one end of the opposing member 722 slides through a slot 716 in the fixed member 720 to adjust to various sized power lines 128. The other end of the opposing member 722 pivots with respect to a pivoting member 724 that pivots with respect to the other jaw 110. In this embodiment, the power line 128 is secured between the hook 708 and the opposing member 722 or non-conductive material 726 if present. Although the power line 128 need not be centered in the opening 114, it is desirable to retain the power line 128 in a consistent position with respect to the opening 114. In this embodiment, larger power lines may be centered inside the opening 114.

A perspective view of the line device 700 illustrates springs 802 that are disposed between a pair of opposing members 722 and an axial member 818 operably coupled to a pair of fixed members 720. The pivoting member 724 and opposing member 722 pivot and/or rotate with respect to the jaws 108 and 110 as the jaws open and close. The sensor 418 is shown disposed in the first jaw 108. A pair of axial stabilizers 818 is shown between the hooks 708 on two axially spaced fixed members 720 and the axially spaced opposing members 722. These axial stabilizers facilitate the movement of the alignment structure 720, 722, and 724 in a substantially simultaneous manner while retaining stability. The fixed members 720 in conjunction with the axial stabilizers 818 bear the load of the device 700.

In each of the embodiments, at least a part of the aligning structure, for example, at least a part of at least one of the alignment members 120, 320, 408/420/422, and 720/722/724, is advantageously non-conductive to prevent the aligning structure from creating an undesirable conductive path that may affect the accuracy of the sensor 418. For example, when two sets of axially-spaced alignment members are utilized, such as in FIG. 6, a first set of axially-spaced alignment members 420, 420, 408, and 422 brings the line device 400 to the same potential as the power line 128 through conductor 602 and the first set is electrically insulated from the second set of axially-spaced alignment members 420, 420, 408, and 422.

Although the aligning structures are shown in the drawings with one orientation with respect to the first jaw 108 and the second jaw 110, other orientations with respect to the jaws 18 and 110 may be possible, including, but not limited to, mirrored or rotated implementations of the aligning structures.

The various embodiments of line devices have alignment members that manually or automatically adapt to various diameters of power lines without the need to install or replace hardware on the line device. A corona ring having spherical ends facilitates easier manufacture. A smaller diameter of cross-section of the corona ring is possible. The opening in the corona ring allows the line device to hang from the power line to facilitate easier installation and removal, including while the power line is energized.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An apparatus comprising:
a first jaw coupled to a second jaw to form an opening when the first jaw and the second jaw are closed around a power line; and
an aligning structure having at least two alignment members axially spaced with respect to a longitudinal axis of the power line, a first of the alignment members being coupled to the first jaw and a second of the alignment members being coupled to the second jaw,
wherein a portion of the aligning structure is disposed within the opening and aligns the power line to a sensor disposed within the first jaw and the second jaw, said coupling between the first and second alignment members to the first and second jaws, respectively, permitting relative movement between the first alignment member and the first jaw such that the first alignment member moves relative to the first jaw during closing movement of said jaws for engaging said power line as said jaws are closed.

2. The apparatus of claim 1, further comprising a corona ring operably coupled to at least one of the first jaw and the second jaw, wherein the corona ring comprises:
a partial ring having a circular cross-section of a first diameter; and
a pair of substantially spherical ends having a second diameter and each disposed at a respective end of the partial ring.

3. The apparatus of claim 1, wherein the aligning structure adjusts to align to various diameters of power lines.

4. The apparatus of claim 1, wherein the sensor is coupled to an electronics assembly.

5. An apparatus comprising:
a first jaw coupled to a second jaw to form an opening when the first jaw and the second jaw are closed; and
an aligning structure coupled to at least one of the first jaw and the second jaw,
wherein a portion of the aligning structure is disposed within the opening and aligns a power line to a sensor disposed within the first jaw and the second jaw,
and said aligning structure comprises a first set and a second set of alignment members that are axially-spaced with respect to a longitudinal axis of the power line, and wherein the first set brings the apparatus to a voltage potential of the power line and the second set is electrically insulated from the first set.

6. An apparatus comprising:
a first jaw and a second jaw coupled together to form an opening when the first jaw and the second jaw are closed;
a corona ring operably coupled to one of the first jaw and the second jaw;
a sensor, a part of which is disposed in the first jaw and consistently positioned with respect to the opening;
an electronic assembly operably coupled to the sensor; and
an aligning structure attached to at least one of the first jaw and the second jaw;
wherein the aligning structure aligns a power line to the sensor and comprises a first set and a second set of alignment members that are axially-spaced with respect to a longitudinal axis of the power line, and wherein the first set brings the apparatus to a voltage potential of the power line and the second set is electrically insulated from the first set.

7. An apparatus comprising:
a first jaw and a second jaw that are coupled together to form an opening when the first jaw and the second jaw are closed;
a corona ring operably coupled to one of the first jaw and the second jaw;
a sensor disposed within the first and the second jaw and consistently positioned with respect to the opening;
an electronic assembly operably coupled to the sensor; and
an aligning structure attached to at least one of the first jaw and the second jaw;
wherein the aligning structure aligns a power line to the sensor and comprises:
a fixed member having a hook and coupled to the first jaw; and an opposing member slidably coupled to the fixed member and pivotally coupled to a pivoting member that pivots with respect to the second jaw; wherein the power line is secured between the hook and the opposing member.

8. An apparatus comprising:

a first jaw and a second jaw that are coupled together to form an opening when the first jaw and the second jaw are closed;

an aligning structure coupled to at least one of the first jaw and the second jaw, wherein the aligning structure aligns a power line to a sensor, said coupling permitting automatic relative movement between said aligning structure and at least one of said jaws during closing movement of said jaws for engaging said power line as said jaws are closed, the aligning structure including a fixed member coupled to the first jaw and having a plurality of adjustment holes for adjusting the aligning structure to different power line sizes, the fixed member being at least partially disposed within the opening, the aligning structure further including an opposing member slidably coupled to the fixed member at one end of the opposing member, the other end of the opposing member being coupled to a pivoting member coupled to the second jaw.

9. The apparatus of claim 8, further comprising:

a corona ring operably coupled to the first jaw or to the second jaw, the corona ring including: a partial ring having a circular cross-section of a first diameter; and a pair of substantially spherical ends having a second diameter and disposed at each end of the partial ring, wherein the second diameter is substantially larger than the first diameter, and wherein the apparatus temporarily hangs from the power line by the corona ring.

* * * * *